(12) United States Patent
Matoba

(10) Patent No.: US 11,127,439 B2
(45) Date of Patent: Sep. 21, 2021

(54) SEMICONDUCTOR DEVICE INCLUDING FIRST-IN FIRST-OUT CIRCUIT

(71) Applicant: LAPIS Semiconductor Co., Ltd., Yokohama (JP)

(72) Inventor: Kenjiro Matoba, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/823,314

(22) Filed: Mar. 18, 2020

(65) Prior Publication Data

US 2020/0312383 A1    Oct. 1, 2020

(30) Foreign Application Priority Data

Mar. 25, 2019    (JP) .............................. JP2019-057477

(51) Int. Cl.
| | |
|---|---|
| *G11C 7/10* | (2006.01) |
| *G11C 7/06* | (2006.01) |
| *G11C 7/22* | (2006.01) |
| *G06F 9/30* | (2018.01) |

(52) U.S. Cl.
CPC .......... *G11C 7/065* (2013.01); *G06F 9/30029* (2013.01); *G11C 7/1015* (2013.01); *G11C 7/1096* (2013.01); *G11C 7/22* (2013.01)

(58) Field of Classification Search
CPC ......... G11C 7/1015; G11C 7/103; G11C 7/22; G11C 7/1096; G11C 7/222; G11C 7/225; G11C 11/419; G11C 11/413
See application file for complete search history.

(56) References Cited

U.S. PATENT DOCUMENTS 5,781,480 A * 7/1998 Nogle .................. G11C 7/1072
365/154

FOREIGN PATENT DOCUMENTS

JP    H11162157    6/1999

* cited by examiner

*Primary Examiner* — Alfredo Bermudez Lozada
(74) *Attorney, Agent, or Firm* — JCIPRNET

(57) ABSTRACT

A semiconductor device including a FIFO circuit in which a data capacity can be increased while minimizing an increase in a circuit scale is provided. The semiconductor device includes a single-port type storage unit (11) which stores data, a flip-flop (12) which temporarily stores write data (FIFO input) or read data (FIFO output) of the storage unit (11), and a control unit (14, 40) which controls a write timing of a data signal, which is stored in the flip-flop (12), to the storage unit (11) or a read timing of the data signal from the storage unit to avoid an overlap between a write operation and a read operation in the storage unit (11).

2 Claims, 5 Drawing Sheets

SEMICONDUCTOR DEVICE INCLUDING FIRST-IN FIRST-OUT CIRCUIT

CROSS-REFERENCE TO RELATED APPLICATION

This application claims the benefit of Japan Application No. 2019-057477, filed on Mar. 25, 2019. The entirety of the above-mentioned patent application is hereby incorporated by reference herein and made a part of this specification.

BACKGROUND

Technical Field

The disclosure relates to a semiconductor device, particularly to a semiconductor device including a first-in first-out (FIFO) circuit.

Description of Related Art

Regarding a FIFO circuit, Japanese Patent Laid-Open No. H11-162157 (Patent Document 1) discloses a FIFO memory device 100 including an input register (REG1) 110, a dual-port RAM (Dport RAM) 120, a first intermediate register (REG2) 131, a second intermediate register (REG3) 132, an output register (REG4) 140, a selection circuit (MUX) 150, a write pointer unit (Wpointer) 160, a write ready signal generation unit (WRDY Gen) 170, a read pointer unit (Rpointer) 180, and a read ready signal generation unit (RRDY Gen) 190.

Conventionally, as shown in Patent Document 1, a FIFO circuit generally uses a dual-port random access memory (RAM). Also, a FIFO circuit may be configured by a D-type flip-flop (DFF) when a capacity thereof is small. FIG. 5 is a block diagram showing a FIFO circuit 50 according to the conventional technology in which key points of the FIFO circuit using a dual-port RAM are extracted and shown. As shown in FIG. 5, the FIFO circuit 50 is configured to include a dual-port RAM (denoted by "Dual-Port-RAM" in FIG. 5) 51, a write pointer (denoted by "Write-Pointer" in FIG. 5) 52, and a read pointer (denoted by "Read-Pointer" in FIG. 5) 53.

In the FIFO circuit 50, FIFO input data (denoted by "FIFO Input" in FIG. 5) is input from a data write port (denoted by "data-in (port-1)" in FIG. 5), and FIFO output data (denoted by "FIFO Output" in FIG. 5) is output from a data read port denoted by "data-out (port-2)" in FIG. 5). A write enable signal (denoted by "write_enable" in FIG. 5) is input to the write pointer 52 and a write enable port we of the dual-port RAM 51, and a read enable signal (denoted by "read_enable" in FIG. 5) is input to the read pointer 53 and a read enable port re of the dual-port RAM 51. The write pointer 52 receives the write enable signal write_enable and outputs a write address to an address port1 (denoted by "address1 (port-1)" in FIG. 5) of the dual-port RAM 51, and the read pointer 53 receives the read enable signal read-enable and outputs a read address to an address port2 (denoted by "address2 (port-2)" in FIG. 5) of the dual-port RAM 51.

However, in the above-described conventional technology, the FIFO circuit using a DFF is not suitable for a large-capacity FIFO circuit. On the other hand, the FIFO circuit 50 using the dual-port RAM 51 is for a large-capacity application but has a disadvantage in that a circuit scale tends to be large, and there are cases in which care needs be taken to prevent timing of writing and reading from the two ports (the write enable port we and the read enable port re) to the dual-port RAM 51 from overlapping (from overlapping).

Considering a recent increase in scale and capacity of a semiconductor device in which a FIFO circuit is embedded, a FIFO circuit itself is required to be increased in a data capacity while an increase in circuit scale is minimized. On the other hand, circuits using FIFO circuits are used for various applications, and depending on applications, there are cases in which perfect asynchronization is not necessarily required in relation between an input timing and an output timing. That is, when a FIFO circuit is configured using a single-port RAM on the assumption that either a write timing or a read timing has a certain degree of regularity, it is considered that a data capacity can be increased while an increase in a circuit scale is minimized. However, such a study has not been made conventionally, including in Patent Document 1.

SUMMARY

A semiconductor device according to the disclosure includes a single-port type storage unit which stores data, a flip-flop which temporarily stores write data or read data of the storage unit, and a control unit which controls a write timing of a data signal, which is stored in the flip-flop, to the storage unit or a read timing of the data signal from the storage unit to avoid an overlap between a write operation and a read operation in the storage unit.

DESCRIPTION OF THE EMBODIMENTS

The disclosure has been made to solve the above problem and provides a semiconductor device including a FIFO circuit in which a data capacity can be increased while an increase in a circuit scale is minimized.

According to the disclosure, it is possible to provide a semiconductor device including a FIFO circuit in which a data capacity can be increased while minimizing an increase in a circuit scale.

Hereinafter, embodiments for implementing the disclosure will be described in detail with reference to the drawings. In the following embodiments, a first-in first-out (FIFO) circuit will be described as an example of a semiconductor device according to the disclosure.

First Embodiment

Figure 1:
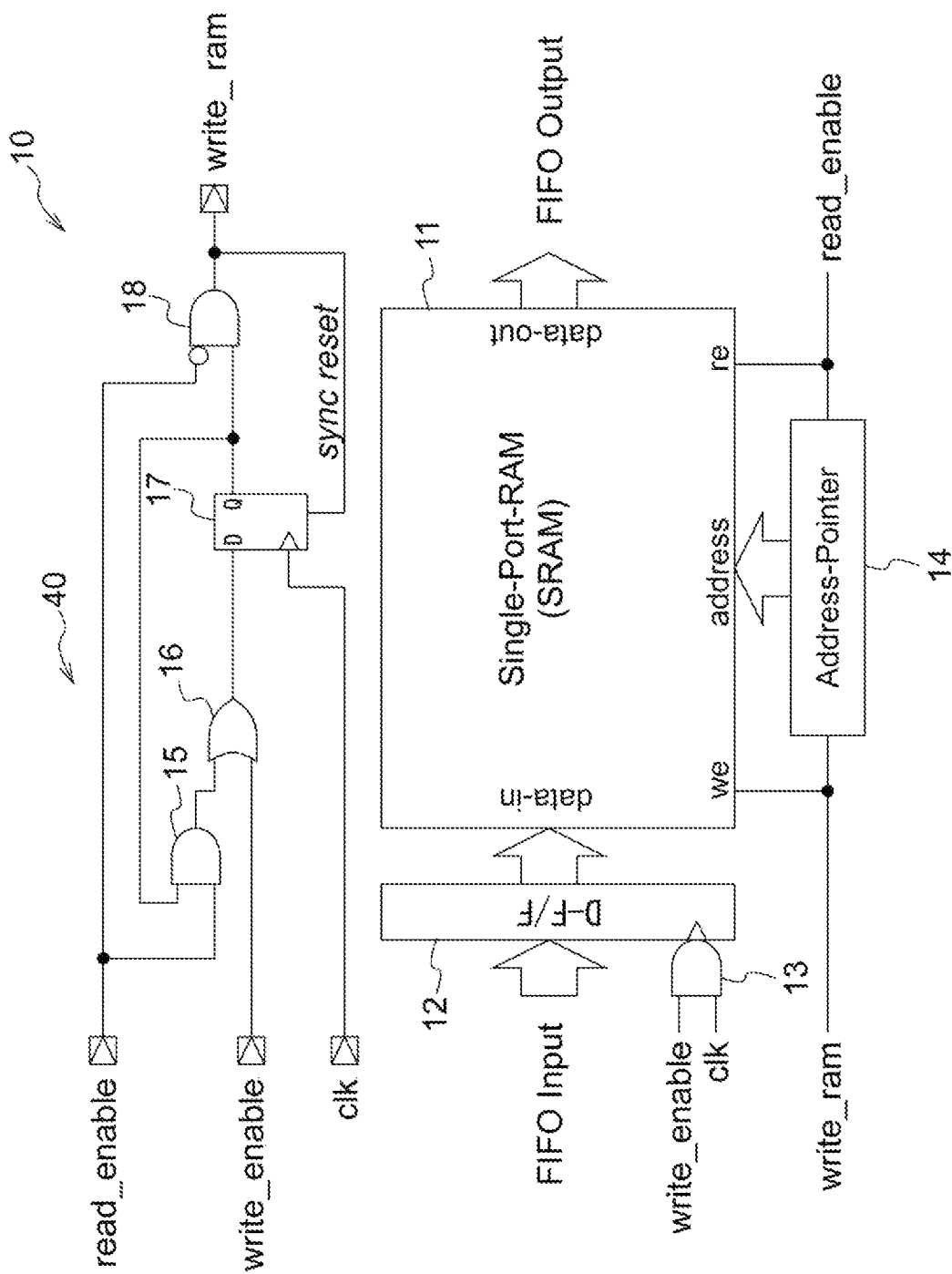
FIG. 1 is a block diagram showing an example of a configuration of a semiconductor device according to a first embodiment.

As shown in FIG. 1, a semiconductor device 10 according to the present embodiment is configured to include a single-port RAM (denoted by "Single-port-RAM (SRAM)" in FIG. 1) 11, a DFF (denoted by "D-F/F" in FIG. 1) 12, an AND circuit 13, an address control circuit 14, and a write RAM signal generation unit 40. Also, the write RAM signal generation unit 40 is configured to include an AND circuit 15, an OR circuit 16, a DFF 17, and an AND circuit 18.

In FIG. 1, FIFO input data (denoted by "FIFO Input" in FIG. 1) is connected to a D input of the DFF 12, a Q output of the DFF 12 is connected to a data write port (denoted by "data-in" in FIG. 1) of the single-port RAM 11, and FIFO output data (denoted by "FIFO Output" in FIG. 1) is connected to a data read port (denoted by "data-out" in FIG. 1) of the single-port RAM 11.

A logical AND of a write enable (denoted by "write-enable" in FIG. 1) signal and a clock (denoted by "clk" in FIG. 1) signal by the AND circuit 13 is connected to a clock input of the DFF 12. A write RAM (denoted by "write_ram" in FIG. 1) signal is connected to a write enable port (denoted by "we" in FIG. 1) of the single-port RAM 11, and a read enable (denoted by "read_enable" in FIG. 1) signal is connected to a read enable port (denoted by "re" in FIG. 1) of the single-port RAM 11. Also, the address control circuit 14 (denoted by "Address-Pointer" in FIG. 1) is connected to an address port (denoted by "address" in FIG. 1) of the single-port RAM 11, a write address is controlled by the write RAM signal write_ram, and a read address is controlled by the read enable signal read_enable.

On the other hand, a configuration of the write RAM signal generation unit 40 is as follows. That is, the write RAM signal write_ram is connected to an output of the AND circuit 18, an inverted signal of the read enable signal read-enable is connected to one input of the AND circuit 18, and a Q output of the DFF 17 is connected to the other input of the AND circuit 18. The write RAM signal write_ram is also connected to a synchronous reset (denoted by "sync reset" in FIG. 1) of the DFF 17. On the other hand, the read enable signal read-enable and the Q output of the DFF 17 are connected to an input of the AND circuit 15, an output of the AND circuit 15 is connected to one input of the OR circuit 16, the write enable signal write_enable is connected to the other input of the OR circuit 16, and a D input of the DFF 17 is connected to an output of the OR circuit 16. Also, a clock signal clk is connected to a clock input of the DFF 17. Then, in the semiconductor device 10 according to the present embodiment, instead of the write enable signal write_enable, a write RAM signal write_ram is input to the write enable port we and the address control circuit 14. Thereby, even though the single-port RAM is used, overlapping (overlapping) between a write timing and a read timing is avoided in the semiconductor device 10.

Figure 2:
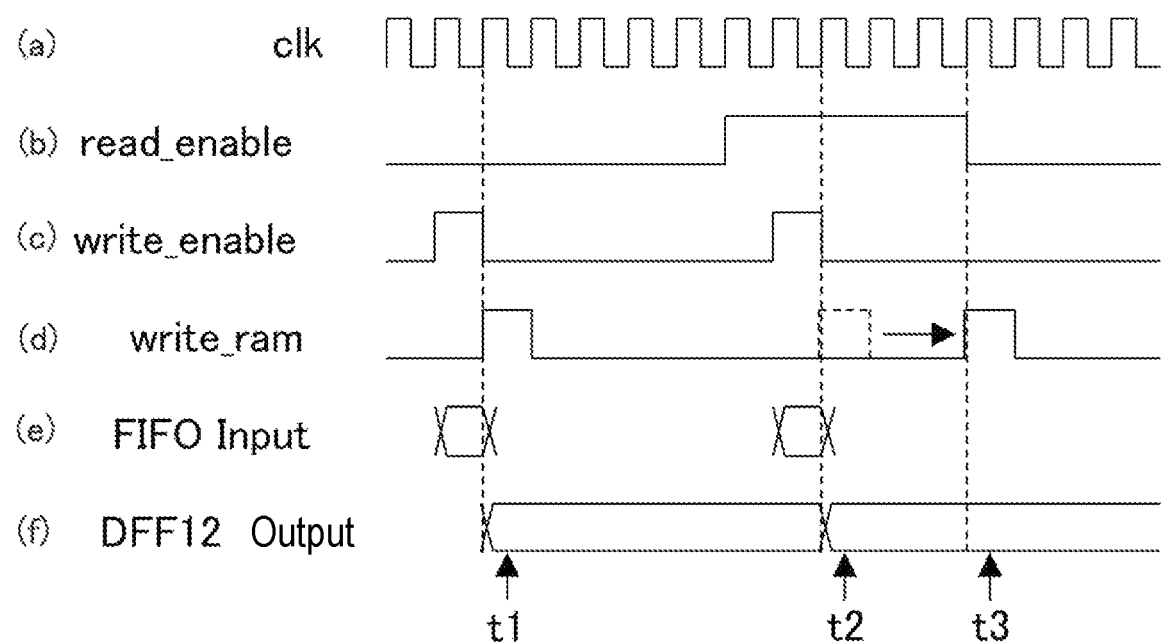
FIG. 2 is a timing chart showing operations of respective parts of the semiconductor device according to the first embodiment.

An operation of the semiconductor device 10 will be described with reference to FIG. 2. FIG. 2 is a timing chart showing waveforms at respective parts of the semiconductor device 10, in which (a) shows a waveform of the clock signal clk, (b) shows a waveform of the read enable signal read_eanble, (c) shows a waveform of the write enable signal write_enable, (d) shows a waveform of the write RAM signal write_ram, (e) shows a waveform of the FIFO input data FIFO Input, and (f) shows an output waveform of the DFF 12.

First, when an "H" pulse is input to the write enable signal write_enable while the read enable signal read_enable is at an "L" level, the FIFO input data FIFO Input, which is write data to the single-port RAM 11, is latched in the DFF 12, and at the next rise of the clock signal clk, the write RAM signal write_ram outputs an "H" pulse, and the FIFO input data that has been latched in the DFF 12 is written to the single-port RAM 11 (time t1).

Next, when an "H" level is input to the write enable signal write-enable while the read enable signal read_enable is at an "H" level, although the FIFO input data FIFO Input, which is write data to the single-port RAM 11, is temporarily latched in the DFF 12, since the single-port RAM 11 is in the middle of being read, no write operation to the single-port RAM 11 is performed (time t2). When the read enable signal read_enable is at an "L" level, the write RAM signal write_ram outputs an "H" pulse, and the FIFO input data FIFO Input that has been latched in the DFF 12 is written to the single-port RAM 11 (time t3). In the semiconductor device 10, the above operation is controlled by the action of the write RAM signal write_ram generated by the write RAM signal generation unit 40.

As described above, according to the semiconductor device 10 of the present embodiment, a FIFO circuit with a large-capacity and small-area can be realized. Further, in a specific design of the semiconductor device 10, the semiconductor device 10 may be configured to be used for applications in which a read cycle does not overlap a write timing two or more consecutive times even when there is an interval (interval) of one clock or more in the read cycle from the FIFO circuit or there is no interval in the read cycle. The semiconductor device 10 according to the present embodiment can be particularly suitably used when a write interval is large and a read interval is small such as, for example, a write side configured of a serial interface and a read side configured of a parallel interface.

Second Embodiment

A semiconductor device 10A according to the present embodiment will be described with reference to FIG. 3. The semiconductor device 10A is also a form in which a semiconductor device according to the disclosure is applied to a FIFO circuit similarly to the semiconductor device 10 and is different mainly in that a read RAM signal is generated instead of a write RAM signal being generated. Therefore, components which are the same as those in the semiconductor device 10 are denoted by the same reference signs, and detailed description thereof may be omitted.

Figure 3:
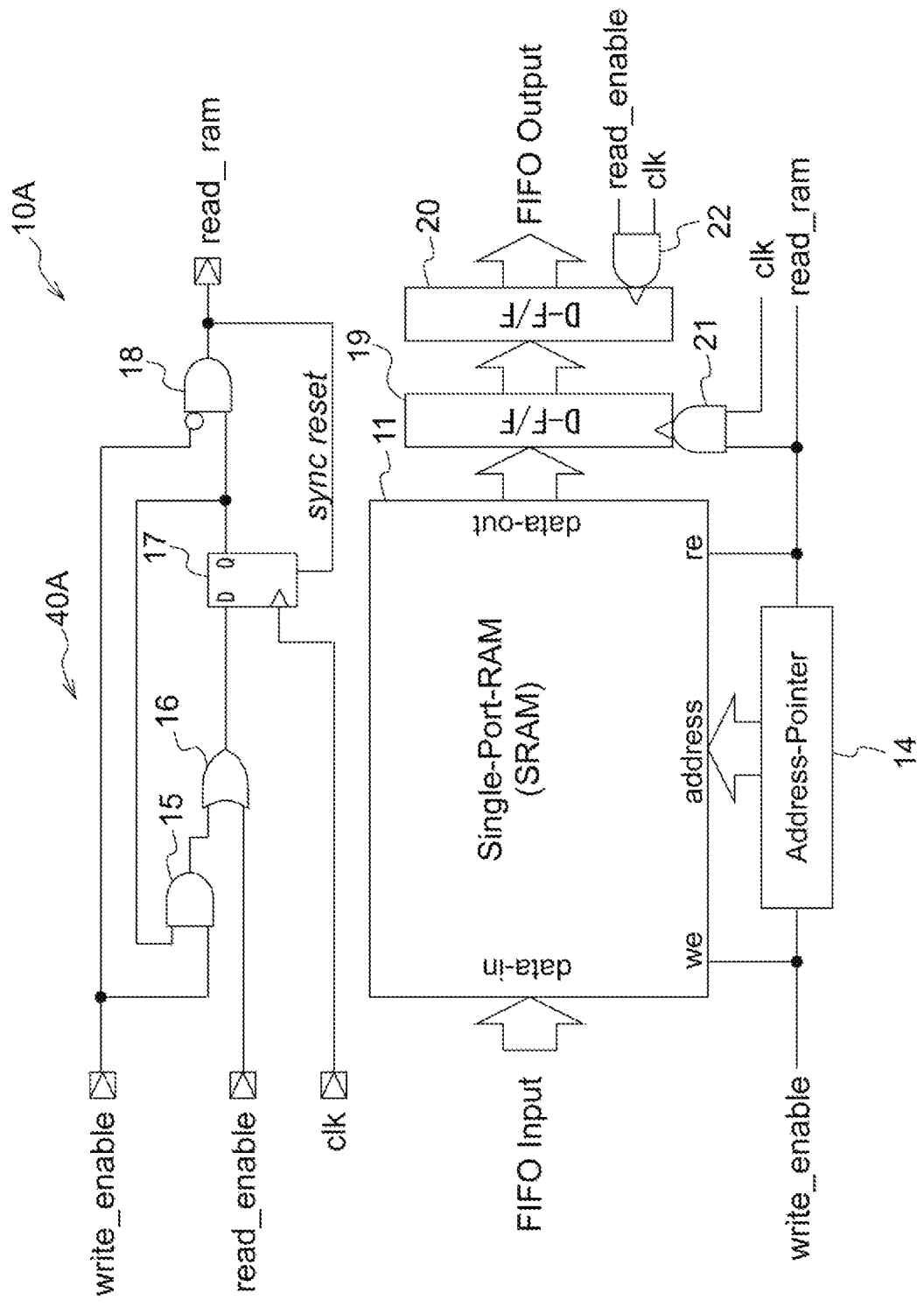
FIG. 3 is a block diagram showing an example of a configuration of a semiconductor device according to a second embodiment.

Compared to the semiconductor device 10, as shown in FIG. 3, the semiconductor device 10A includes a read RAM signal generation unit 40A instead of the write RAM signal generation unit 40 and includes DFFs 19 and 20 and AND circuits 21 and 22 instead of the DFF 12 and the AND circuit 13.

FIFO input data FIFO Input is connected to a data write port data-in of a single-port RAM 11, a D input of the DFF 19 is connected to a data read port data-out of the single-port RAM 11, a Q output of the DFF19 is connected to a D input of the DFF20, and a Q output of the DFF20 is connected to the FIFO output data FIFO Output (that is, output of the FIFO circuit) of the semiconductor device 10A. A logical AND of a clock signal clk and a read RAM signal read_ram by the AND circuit 21 is connected to a clock input of the DFF 19, and a logical AND of a clock signal clk and a read enable signal read_enable by the AND circuit 22 is connected to a clock input of the DFF 20.

A write enable signal write_enable is connected to a write enable port we of the single-port RAM 11, a read RAM signal read_ram is connected to a read enable port re of the single-port RAM 11, and an address control circuit 14 is connected to an address port address of the single-port RAM 11. That is, an address in an operation of the semiconductor device 10A is controlled by the write enable signal write_enable and the read RAM signal read_ram.

A configuration of the read RAM signal generation unit 40A is as follows. That is, the read RAM signal read_ram is connected to an output of an AND circuit 18, an inverted signal of the write enable signal write_enable is connected to one input of the AND circuit 18, and a Q output of the DFF 17 is connected to the other input of the AND circuit 18. The read RAM signal read_ram is also connected to a synchronous reset sync reset of a DFF17. The write enable signal write_enable and the Q output of the DFF 17 are connected to an input of an AND circuit 15, an output of the AND circuit 15 is connected to one input of an OR circuit 16, the read enable signal read_enable is connected to the other input of the OR circuit 16, and a D input of the DFF 17 is connected to an output of the OR circuit 16. The clock signal clk is connected to a clock input of the DFF 17.

Figure 4:
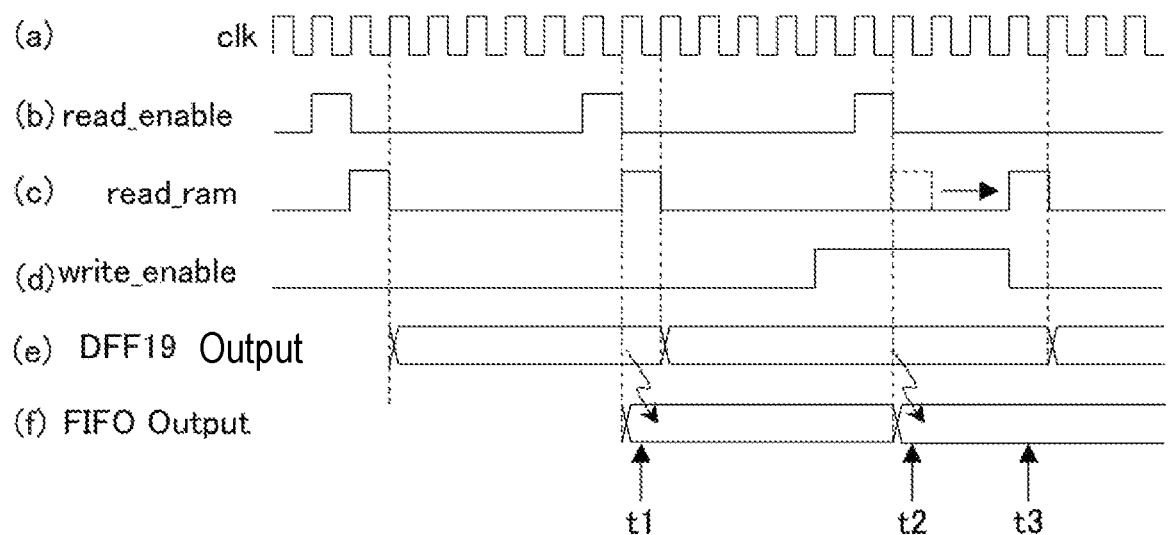
FIG. 4 is a timing chart showing operations of respective parts of the semiconductor device according to the second embodiment.
Figure 5:
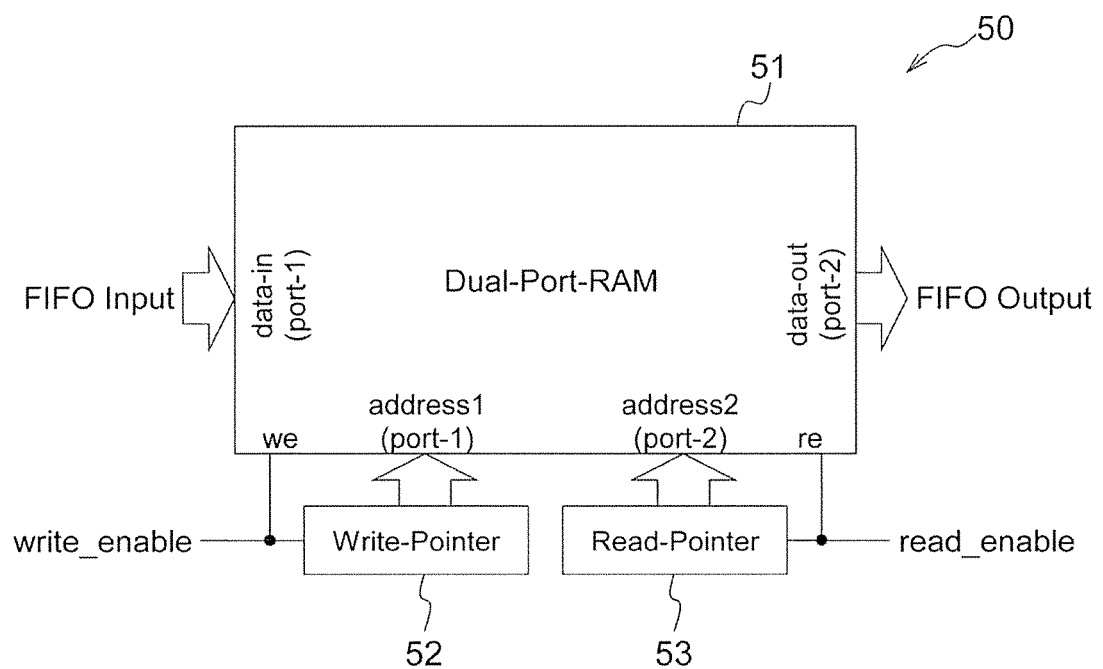
FIG. 5 is a block diagram showing a FIFO circuit according to a conventional technology.

An operation of the semiconductor device 10A will be described with reference to FIG. 4. FIG. 4 is a timing chart showing waveforms at respective parts of the semiconductor device 10A, in which (a) shows a waveform of the clock signal clk, (b) shows a waveform of the read enable signal read_enable, (c) shows a waveform of the read RAM signal read_ram, (d) shows a waveform of the write enable signal write_enable, (e) shows an output waveform of the DFF 19, and (f) shows a waveform of the FIFO output data FIFO Output.

First, when an "H" pulse is input to the read enable signal read_enable while the write enable signal write_enable is at an "L" level, data that has been stored in the DFF 19 is latched in the DFF 20 as the FIFO output data FIFO Output. The read RAM signal read_ram outputs an "H" pulse at the next rise of the clock signal clk, and the data that has been stored in the single-port RAM 11 is latched in the DFF 19 so that the next FIFO output data FIFO Output is in a prepared state (time t1).

Next, in a case in which an "H" level is input to the read enable signal read_enable while the write enable signal write_enable is at an "H" level, when an "H" pulse is input to the read enable signal read_enable, although the data that has been stored in the DFF19 is latched in the DFF20 as the FIFO output data FIFO Output, since the single-port RAM 11 is in the middle of being written, at the next rise of the clock signal clk, the read RAM signal read_ram does not become an "H" level, no data is read from the single-port RAM 11, and a value of the DFF 19 is not updated (time t2).

Next, when the write enable signal write_enable is at an "L" level, the read RAM signal read_ram outputs an "H" pulse, and data read from the single-port RAM 11 is latched in the DFF 19 to prepare the next FIFO output data (time t3).

As described above, according to the semiconductor device 10A of the present embodiment, a FIFO circuit with a large-capacity and small-area can be realized. Further, in a specific design of the semiconductor device 10A, the semiconductor device 10A may be configured to be used for applications in which a write cycle does not overlap a read timing two or more consecutive times even when there is an interval of one clock or more in the write cycle from the FIFO circuit or there is no interval in the write cycle. The semiconductor device 10A according to the present embodiment can particularly be suitably used when a read interval is large and a write interval is small, such as, for example, a read side configured of a serial interface and a write side configured of a parallel interface.

Further, in the first embodiment described above, an example in which one DFF 12 is connected to the data write port data-in has been described, but two or more DFFs may be connected thereto to increase a degree of freedom in access timing.

Also, in the second embodiment described above, an example in which two DFFs 19 and 20 are connected to the data read port data-out has been described, but three or more DFFs may be connected thereto to increase a degree of freedom in access timing.

The circuit configuration described in each of the above embodiments is merely an example, and other circuits having a similar function can be used as appropriate.

What is claimed is:

1. A semiconductor device comprising:
a single-port type storage unit which stores data;
a flip-flop which temporarily stores write data or read data of the storage unit; and
a control unit which controls a write timing of a data signal stored in the flip-flop to the storage unit or a read timing of the data signal from the storage unit to avoid an overlap between a write operation and a read operation in the storage unit, wherein
the control unit comprises:
an address control unit which controls a write address on the basis of a write control signal and controls a read address on the basis of a read control signal when writing and reading the storage unit; and
a generation unit which outputs a signal that determines the write timing or the read timing on the basis of a write enable signal and a read enable signal as the write control signal or the read control signal, and wherein
the flip-flop comprises a first D-type flip-flop connected to a data write port of the storage unit in which the write data is input to a data input and a logical AND of the write enable signal and a clock signal is input to a clock input,
the generation unit outputs a signal that determines the write timing as the write control signal, and
the read enable signal is input to the address control unit as the read control signal.

2. A semiconductor device comprising:
a single-port type storage unit which stores data;
a flip-flop which temporarily stores write data or read data of the storage unit; and
a control unit which controls a write timing of a data signal stored in the flip-flop to the storage unit or a read timing of the data signal from the storage unit to avoid an overlap between a write operation and a read operation in the storage unit, wherein
the control unit comprises:
an address control unit which controls a write address on the basis of a write control signal and controls a read address on the basis of a read control signal when writing and reading the storage unit; and
a generation unit which outputs a signal that determines the write timing or the read timing on the basis of a write enable signal and a read enable signal as the write control signal or the read control signal, and wherein
the flip-flop comprises:
a second D-type flip-flop connected to a data read port of the storage unit in which the read data is input to a data input and a logical AND of the read control signal and a clock signal is input to a clock input; and
a third D-type flip-flop in which an output of the second D-type flip-flop is input to a data input and a logical AND of the read enable signal and the clock signal is input to a clock input, the generation unit outputs a signal that determines the read timing as the read control signal, and the write enable signal is input to the address control unit as the write control signal.

* * * * *